US008878366B2

(12) United States Patent
Patti

(10) Patent No.: US 8,878,366 B2
(45) Date of Patent: Nov. 4, 2014

(54) CONTACT PAD

(75) Inventor: Davide Giuseppe Patti, Mascalucia (IT)

(73) Assignee: STMicroelectronics S.r.l., Agrate Brianza (MB) (IT)

(*) Notice: Subject to any disclaimer, the term of this patent is extended or adjusted under 35 U.S.C. 154(b) by 157 days.

(21) Appl. No.: 13/543,992

(22) Filed: Jul. 9, 2012

(65) Prior Publication Data

US 2013/0020714 A1 Jan. 24, 2013

(30) Foreign Application Priority Data

Jul. 22, 2011 (IT) .............................. MI2011A1370

(51) Int. Cl.

| H01L 29/72 | (2006.01) |
|---|---|
| H01L 23/00 | (2006.01) |
| H01L 29/417 | (2006.01) |
| H01L 29/45 | (2006.01) |
| H01L 29/66 | (2006.01) |
| H01L 29/78 | (2006.01) |

(52) U.S. Cl.
CPC .......... *H01L 24/05* (2013.01); *H01L 29/41741* (2013.01); *H01L 29/456* (2013.01); *H01L 24/03* (2013.01); *H01L 29/66712* (2013.01); *H01L 29/7802* (2013.01); *H01L 24/48* (2013.01); *H01L 2224/05166* (2013.01); *H01L 2224/05184* (2013.01); *H01L 2224/05624* (2013.01); *H01L 2224/45124* (2013.01); *H01L 2224/45144* (2013.01); *H01L 2224/45147* (2013.01); *H01L 2924/01006* (2013.01); *H01L 2924/014* (2013.01); *H01L 2924/10253* (2013.01); *H01L 2224/48463* (2013.01); *H01L 2224/48624* (2013.01); *H01L 2224/48824* (2013.01); *H01L 2224/48724* (2013.01); *H01L 2924/01013* (2013.01); *H01L 2924/01014* (2013.01); *H01L 2924/01029* (2013.01); *H01L 2924/01015* (2013.01)
USPC .......................................... 257/773; 438/612

(58) Field of Classification Search
USPC ........................................... 257/773; 438/612
See application file for complete search history.

(56) References Cited

U.S. PATENT DOCUMENTS

| 5,751,065 A * | 5/1998 | Chittipeddi et al. .......... 257/758 |
|---|---|---|
| 2002/0093088 A1 | 7/2002 | Wang |
| 2003/0166334 A1 * | 9/2003 | Lin et al. ....................... 438/627 |

OTHER PUBLICATIONS

Italian Search Report and Written Opinion for MI2011A001370 mailed Apr. 20, 2012 (10 pages).
Robert Reuss, et al.: "Application of Rapid Thermal Processing for Simultaneous BPSG and Contact Reflow, and Poly Emitter Anneal," Motorola, Inc. Technical Developments, vol. 15, May 1992 (pp. 74-77).
Mike Maxim, et al.: "Borophosphosilicate Glass (BPSG) Fusion Using Rapid Thermal Annealing and Steam Reflow: Physical Properties and Device Implications," Mat. Res. Soc. Symp. Proc. vol. 342, 1994 Materials Research Society (pp. 289-296).
German Office Action for DE 102012014428.8 mailed Apr. 30, 2013 (8 pages).

* cited by examiner

*Primary Examiner* — Edward Wojciechowicz
(74) *Attorney, Agent, or Firm* — Gardere Wynne Sewell LLP

(57) ABSTRACT

A contact pad for an electronic device integrated in a semiconductor material chip is formed from a succession of protruding elements. Each protruding element extends transversally to a main surface of the chip and has a rounded terminal portion. Adjacent pairs protruding elements define an opening which is partially filled with a first conductive material to form a contact structure that is in electrical contact with an integrated electronic device formed in the chip. A layer of a second conductive material is deposited to cover said protruding elements and the contact structures so as to form the contact pad.

25 Claims, 5 Drawing Sheets

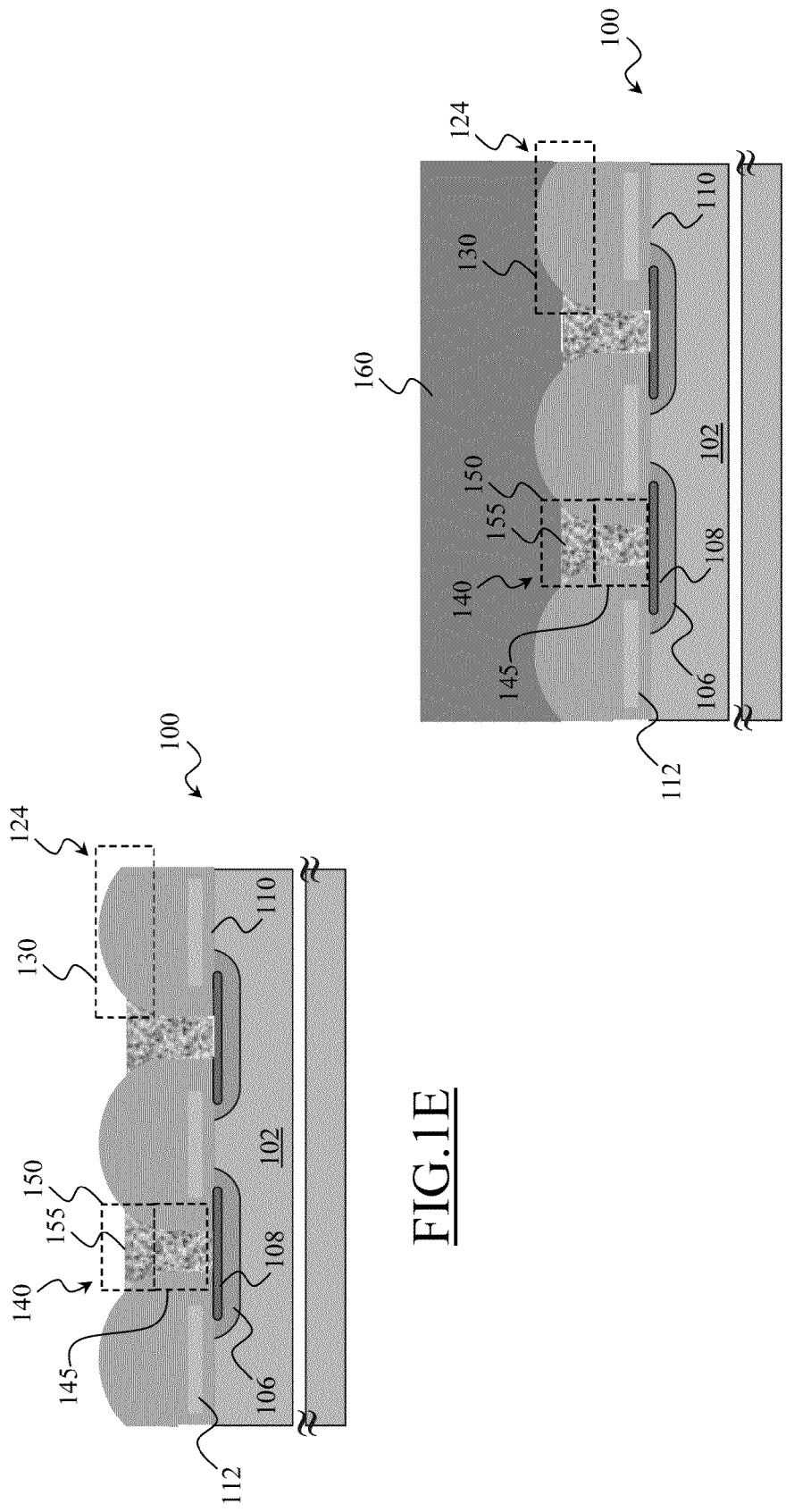

CONTACT PAD

PRIORITY CLAIM

This application claims priority from Italian Application for Patent No. MI2011A001370 filed Jul. 22, 2011, the disclosure of which is hereby incorporated by reference.

TECHNICAL FIELD

The present invention refers to the electronic field. In greater detail, the present invention refers to contact pads for integrated electronic circuits and a corresponding method for manufacturing the same.

BACKGROUND

Thanks to the actual integration technologies, it is possible to integrate micro devices, such as electronic circuits, micromechanicals and/or optical structures, in a chip obtained from a wafer of semiconductor material (for example, silicon). Particularly, the silicon wafer is subjected to a series of selective lithographic processes, at the end of which a plurality of replicas of the desired integrated devices is formed on the semiconductor material wafer. At this point, the processed wafer is subjected to cutting operations, thus obtaining a plurality of chips. At the end of the cutting operations, each chip will result comprising of a corresponding set of integrated circuits. Typically, the chips are then encapsulated into respective packages whose features depend on the use which the devices are intended to. In jargon, the encapsulating operations are referred to as "packaging operations".

In order to access from the outside the electronic devices of the circuit integrated in a chip, the chip is provided with a plurality of contact pads (or simply "pads"). Briefly, a contact pad is an exposed portion—i.e., lacking of any overhanging passivation layer—of the chip surface, made of metallic material. The contact pad is connected to the electronic devices of the integrated circuit through proper conductive material tracks formed in the chip, and connected to a corresponding pin which is exposed on the surface of the package enclosing the chip by means of a conductor material wire (for example, aluminum, gold or copper). The wire is attached at both its ends, i.e., both at the pin and at the contact pad, using combinations of heat, pressure and ultrasound energy.

Typically, the architecture of a circuit integrated in a chip is such that the portions of the chip located under the contact pads lack of any electronic device. Indeed, the portion of the chip that is below a contact pad is subjected to significant thermo-mechanical stresses during the operation carried out for attaching the wire to the pad itself; such thermo-mechanical stresses could significantly change the electric features of the chip underlying zone, and/or cause the occurrence of structural failures. If a contact pad was formed above an electronic device, the electric behavior of such device would become degraded because of the attachment operation of the wire to such contact pad.

With the same materials, the diameter of the wires connecting the pins to the contact pads—and the area of the contact pads themselves—are typically determined by the amount of current which the electronic devices integrated in the chip are destined to manage. The higher the amount of current requested/generated by the devices integrated in the chip, the wider the diameter of the wires and the area of the contact pads which they are attached to.

Consequently, as the amount of current requested/generated by the integrated circuit increases, the portion of the chip dedicated to the contact pads necessarily increases. Since in the portions of the chip located under the contact pads it is not possible to integrate electronic devices, with the same chip total surface, the free space for the integration of integrated devices diminishes as the amount of current requested/generated by the integrated circuit increases. Considering in particular the circuits for power applications, wherein the integrated circuits are adapted to manage very high current amounts, the whole size of the chip which is sufficient to house both the contact pads that the electronic devices may excessively increase.

In the light of the above, the applicant has observed that the known solutions presently employed for manufacturing contact pads do not allow to exploit in an optimal way the potential integration capabilities offered by the semiconductor material chips.

SUMMARY

One or more aspects of a solution according to specific embodiments are provided in the independent claims, with advantageous features of the same solution which are provided in the dependent claims (whose text is herein incorporated by reference).

More specifically, an aspect of the solution according to an embodiment relates a method for manufacturing a contact pad of at least one electronic device integrated in a semiconductor material chip. The method comprises generating a succession of protruding elements on a main surface of the chip. Each protruding element extends transversally to said main surface moving away from the chip and has a rounded terminal portion. Each pair of adjacent protruding elements in the succession define a respective opening. The method further comprises partially filling said openings with a first conductive material for forming contact structures adapted to electrically contact the at least one integrated electronic device, and deposing a layer of a second conductive material in such a way to cover said protruding elements and said contact structures.

A further aspect of a solution according to an embodiment relates to a contact pad.

A still further aspect of a solution according to an embodiment relates a system comprising at least one electronic device integrated in a semiconductor material chip and at least one contact pad.

BRIEF DESCRIPTION OF THE DRAWINGS

A solution according to one or more embodiments, as well as further features and related advantages, will be better understood with reference to the following detailed description, provided merely by way of indicative and non-limitative examples, to be read in conjunction with the attached drawings (in which corresponding elements are indicated with equal or similar references and their explanation is omitted for the sake of brevity). On this regard, it is expressively intended that the figures are not necessarily in scale (with some particulars that could be exaggerated and/or simplified) and that, unless contrarily indicated, they are simply used to conceptually illustrate the described structures and procedures. Particularly:

FIGS. 1A-1E are sectional views of a portion of a semiconductor material wafer during intermediate phases of a method for manufacturing a contact pad according to an embodiment;

FIG. 1F is a sectional view of a contact pad formed with the method illustrated in FIGS. 1A-1E according to an embodiment;

DETAILED DESCRIPTION OF THE DRAWINGS

In the following of the description it will be described a method for the manufacturing of a contact pad for the source terminal of a power MOS transistor according to an embodiment. Specifically, the power MOS transistor herein considered is a vertical MOS transistor, with the source electrode that is subdivided in a plurality of cells, e.g., having a squared or hexagonal shape; a MOS transistor of this type is denoted in jargon MOS transistor with "cellular structure". Similar considerations may be applied as well as to transistors of different types, such as for example the transistors whose source electrode is subdivided in a plurality of stripes.

Figure 1A:
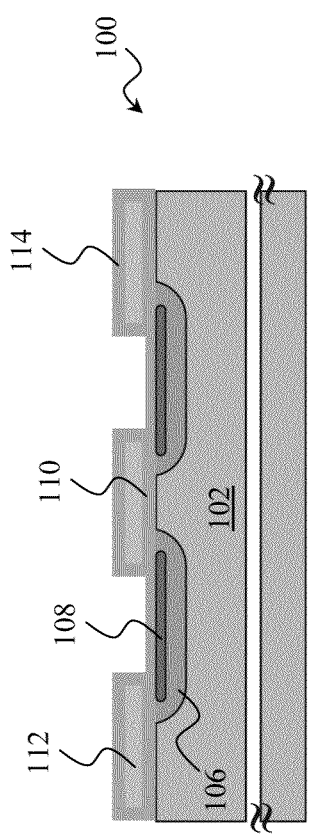

Firstly, the method provides for carrying out on a monocrystalline silicon wafer (standard) process operations for the formation of the transistor up to the phase immediately preceding the formation of the electric contacts of the transistor electrodes located on the surface of the wafer. As it is known to the skilled technicians, such operations comprise the application of known epitaxial growth, deposition, ionic implantation, photolithography and diffusion techniques. A possible example of silicon wafer processed up to the phase preceding the formation of the electric contacts of the transistor electrodes is illustrated in FIG. 1A. Specifically, FIG. 1A is a sectional view of a portion of the wafer wherein two source cells of the transistors are visible.

The silicon wafer is globally identified in figure with the numeric reference 100. The intermediate layer of the wafer 100 defines the drift region 102 of the transistor; the drift region 102 is formed of silicon doped with n-type impurities. A plurality of base regions 106 (two in figure) formed of silicon doped with p-type impurities is formed on the upper surface of the wafer 100. A corresponding source region 108 formed of silicon doped with n-type impurities is in turn formed in each base region 106. Each source region 108 corresponds in turn to a respective source cell of the transistor. A thin oxide layer 110 is thermally grown on the upper surface of the wafer 100, used to carry out the function of gate oxide. The gate electrode of the transistor is formed by means of a plurality of gate conductive stripes 112 made of polysilicon; each gate stripe 112 is formed on the oxide layer 110 between a respective pair of base regions 106, in such a way to extend from a portion of the source region 108 included in one of the base regions 106 of the pair to a portion of the source region 108 included in the other base region 106. The gate stripes 112 are connected to one another in a portion of the wafer 100 that is not visible in figure. A further oxide layer 114 is then deposed on the wafer 100 in such a way to cover and insulate all the gate stripes 112. It has to be noted that, for the sake of description, the drain region of the transistor is not visible in figure, which drain region is in any case formed on the lower surface of the wafer 100.

The main phases of a method for forming a contact pad for the electrical link with the source regions 108 will be now illustrated according to an embodiment.

Figure 1B:
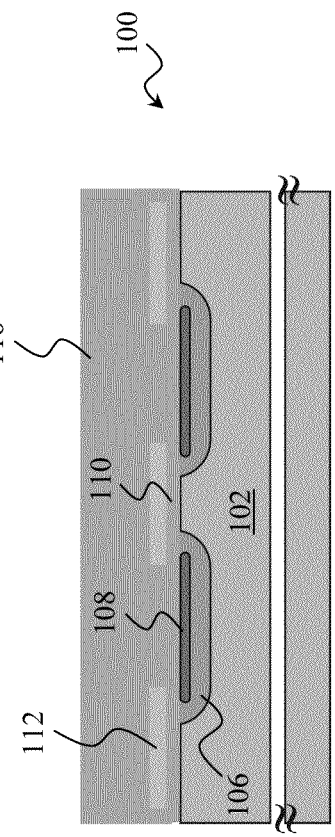

Making reference to FIG. 1B, an intermediate layer (having a thickness comprised for example between 1 and 2 μm) of dielectric material 116, such as Tetraethyl orthosilicate (TEOS) or Borophosphosilicate glass (BPSG), is deposed on the wafer 100, in such a way to entirely cover the underlying layers previously formed; the intermediated layer 116 is then planarized by means of a proper lapping process.

Figure 1C:
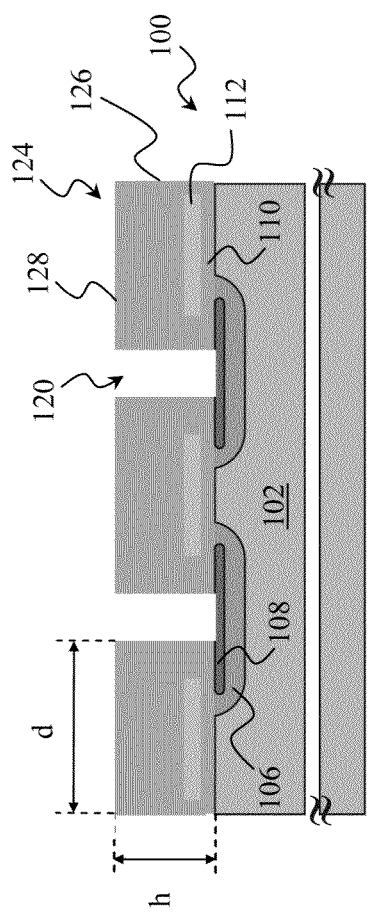

As illustrated in FIG. 1C, the previously deposed intermediate layer 116 is subjected to an anisotropic selective etching operation in such a way to generate openings 120 at each base region 106. The depth of the openings 120 is such to uncover for each base region 106 a central portion of the corresponding source region 108. Further to the openings 120 formation, the intermediate layer 116 results to be conformed in such a way to exhibit a succession of protruding elements 124 having a substantially rectangular transversal section (along a plane perpendicular to the wafer 100 surface).

Substantially all the lateral walls of the protruding elements 124 which perpendicularly extend to the wafer 100 surface—identified in figure with the reference 126—have a same height h. Since in a MOS transistor with cellular structure the base regions 106 are typically uniformly distributed on the wafer 100 surface, also the upper faces of the protruding elements 124 that extend substantially parallel to the wafer 100 surface—identified in figure with the reference 128—result to have a same width d.

Figure 1D:
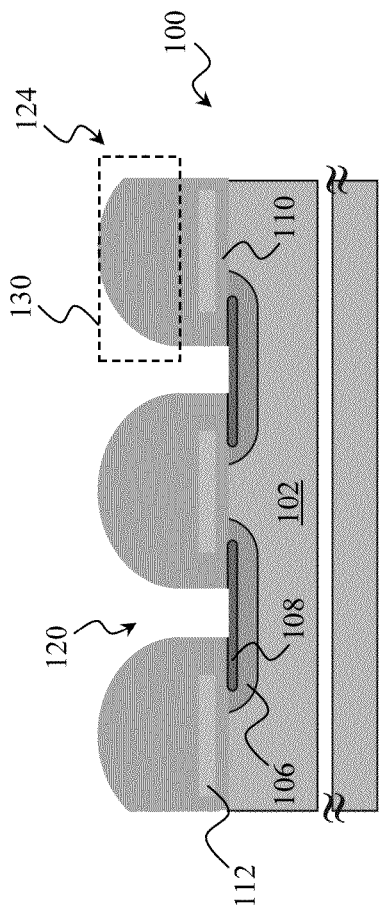

The processed wafer 100 is then subjected for a short time to a high temperature thermal process—for example, the wafer is brought to a temperature of 1100-1160° C. for a time interval of the duration of 30-60 seconds—in order to modify the profile of the protruding elements 124. As illustrated in FIG. 1D, the thermal process is calibrated in such a way to round out (or dome) the profile of the protruding elements 124. During the thermal process, the dielectric material forming the protruding elements 124 passes from a solid condition to a condition corresponding to a high-viscosity fluid. The upper portion of each protruding element 124—identified in figure with the reference 130—tends to depose itself into a lower energy configuration, assuming thus the shape of a solid portion having a rounded surface, so that the transversal section of each protruding element 124 passes from rectangular to substantially curved. In the example illustrated in FIG. 1D, the upper portions 130 have a transversal section that is substantially semicircular, with radius of curvature depending on the width of the protruding elements, i.e, equal to ½*d.

The following phase of the method provides for the filling of the openings 120 by means of an alternate succession of barrier materials and metallic materials, such as for example an alternate succession of titanium/titanium nitride and tungsten layers, in order to form corresponding contact structures, identified in FIG. 1E with the reference 140. Each contact structure 140 comprises a lower portion 145 contacting a respective source region 108, and an upper portion 150 which extends (moving away from the wafer 100 surface) along the opening 120. While the lower portion 145 of the contact structure 140 has a substantially rectangular transversal section (thus, having a constant width), the upper portion 150 has a flared form, which enlarges moving away from the wafer 100 surface following the rounded surface of the upper portion 130. The height of the contact structures 140 is set, for example by means of a subsequent chemical etching operation (of the etchback type), in such a way that the upper portion 150 extends (along a direction perpendicular to the wafer 100 surface) until reaching an intermediate portion of the upper portion 130 of the adjacent protruding elements 124.

According to an embodiment of the present invention, the chemical etching is calibrated so that the upper portions 150 exhibit upper faces 155 that are parallel to the wafer 100 surface, and so that such upper faces 155 are all located at the same height with respect to the wafer 100 surface. It has to be noted that such height results to be lower than the higher height reached by the upper portions 130 of the protruding elements 124, so that portions of such protruding elements 124 protrudes from the plane defined by the upper faces 155.

As will be understood more clearly in the following of the present description, the contact structures 140 function as conductive elements for the electric contact with the source regions 108 as well as mechanical support elements for the contact pad corresponding to the source regions. Specifically, the formation of the contact pad used for the exchange of electric signals among the source regions 308 of the transistor and the outside of the transistor itself provides for the deposition of a metallic material layer, such as aluminum, adapted to cover both the contact structures 140 and the upper portions 130. FIG. 1F illustrates the situation after the deposition, wherein the contact pad, identified with the reference 160, is entirely formed. For example, the resulting thickness of the metallic layer forming the contact pad 160 may be comprised within 3 and 7 μm.

As can be observed from FIG. 1F, the lower portion of the contact pad 160 adheres to the upper portions 150 of the contact structures 140, particularly, to the upper faces 155 of the same, as well as to the upper portions 130 of the protruding elements 124 protruding from the plane defined by the upper faces 155. As a consequence, the lower portion of the contact pad 160 results to be provided with a plurality of cavities—particularly, one cavity for each protruding portion. The presence of such cavities allows to discharge the compression stresses which the contact pad 160 may be subjected to—during the operations carried out for attaching the wire to the pad itself—mainly at the contact structures 140.

Figure 2:
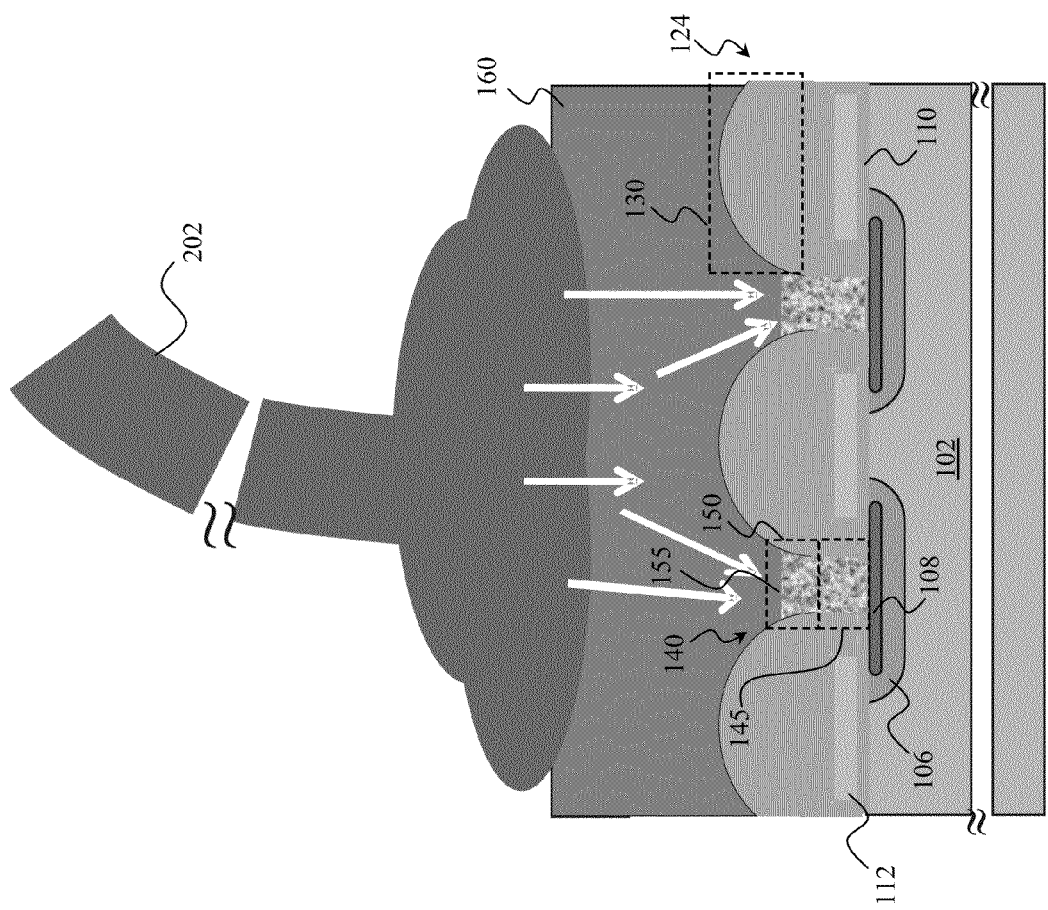
FIG. 2 is a sectional view of the contact pad of FIG. 1F during the soldering of a conductive wire to the pad itself.

Further to the cutting of the wafer for obtaining the chips, conductive wires are soldered to the contact pads of each chip. Making reference in particular to FIG. 2, when a conductive wire 202 is soldered to the contact pad 160, the portions under the contact pad 160 itself are subjected to sensible thermo-mechanical stresses. However, thanks to the particular conformation of the lower portion of the contact pad 160 and of the protruding elements 124, the thermo-mechanical stresses (identified in figure with white arrows) "slide" along the curved profiles of the upper portions 130 of the protruding elements 124 and mainly concentrate on the contact structures 140. In this way, it is avoided to excessively load the portions of the transistor located under the protruding elements 124, i.e., the fragile oxide layers 110 and the fragile gate stripes 112 formed in polysilicon.

Reassuming, thanks to the proposed solution, it is possible to form contact pads in a semiconductor material chip directly above portions of the latter wherein electronic devices are integrated. In this way, not having to necessarily dedicate chip portions exclusively for the formation of the contact pads, it is possible to efficiently exploit the whole area offered by the chip itself.

Figure 3:
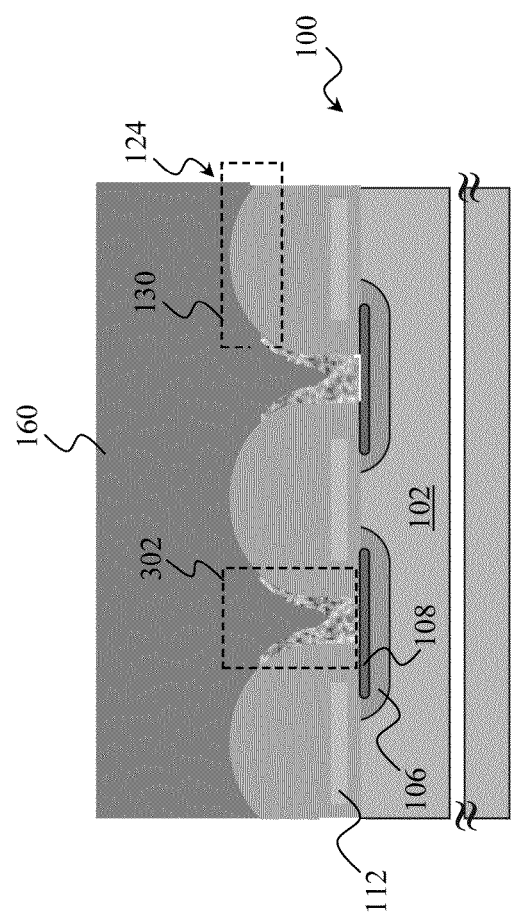
FIG. 3 is a sectional view of a contact pad according to an alternative embodiment.

According to an alternative embodiment illustrated in FIG. 3, after the formation of the protruding elements 124 with upper portions 130 having semicircular sections, a metallization conformal layer (for example, tungsten) is deposed within the opening 120, having a thickness equal to about half the width of the openings 120 themselves. Subsequently, such conformal layer is subjected to an anisotropic etching in such a way that the resulting contact structures—identified in figure with the reference 302—result to have transversal sections substantially with a "V" shape. Thanks to the peculiarity of their shape, the contact structures 302 result to be more flexible compared to the corresponding contact structures 140 depicted in the preceding figures, and thus they are able to manage the thermo-mechanical stresses generated during the operations for the attachment of the conductive wire 202 to the contact pad 160 in a more efficient way.

Naturally, in order to satisfy local and specific requirements, a person skilled in the art may apply to the solution described above many logical and/or physical modifications and alterations. Particularly, although the present invention has been described with a certain degree of particularity with reference to one or more embodiment(s) thereof, it should be understood that various omissions, substitutions and changes in the form and details as well as other embodiments are possible. Particularly, different embodiments of the invention may be put in practice even without the specific details (such as the numeric examples) depicted in the above description for providing a more complete comprehension thereof; on the contrary, well known features may have been omitted or simplified in order not to obscure the description with unnecessary particulars. Moreover, it is expressly intended that specific elements and/or method steps described in connection with any disclosed embodiment of the invention may be incorporated in any other embodiment as a general matter of design choice.

For example, although in description reference has been made to a method for generating contact pads for vertical power MOS transistors, specifically having a cellular structure, the concepts of the present invention may be applied to any type of integrated circuit, as long as the more fragile portions of the electronic devices integrated in the portions below the pads are located exactly under the protruding elements provided with rounded surfaces.

Analogous considerations apply if the same solution is implemented with an equivalent method (using similar steps with the same functions of more steps or of portion thereof, removing some nonessential steps, or adding further optional steps); moreover, the steps may be carried out in a different order, in parallel or (at least in part) overlapped.

What is claimed is:

1. A method for manufacturing a contact pad of at least one electronic device integrated in a semiconductor material chip, the method comprising:
generating a succession of protruding elements on a main surface of the chip, each protruding element extending transversally to said main surface moving away from the chip and having a rounded terminal portion with a transversal cross-section that is substantially semicircular, each pair of adjacent protruding elements in the succession defining a respective opening, wherein generating the succession of protruding elements comprises forming a succession of intermediate protruding elements and applying heat to form the rounded thermal portion;
partially filling said openings with a first conductive material for forming contact structures adapted to electrically contact the at least one integrated electronic device, and
depositing a layer of a second conductive material in such a way to cover said protruding elements and electrically contact said contact structures.

2. The method according to claim 1, wherein forming a succession of intermediate protruding elements comprises:
depositing a dielectric material layer on the main surface; and
selectively etching the dielectric material layer for forming the succession of intermediate protruding elements having a transversal section that is substantially rectangular.

3. The method according to claim 2, wherein applying heat comprises rounding out the intermediate protruding elements for obtaining the protruding elements.

4. The method according to claim 1, wherein partially filling the openings with the first conductive material comprises filling the openings until reaching an intermediate portion of the terminal portions of the protruding elements.

5. The method according to claim 1, wherein partially filling the openings with the first conductive material comprises partially filling the openings with an alternate succession of layers comprising a selected one of: a titanium layer, a titanium nitride layer and a tungsten layer.

6. The method according to claim 1, wherein depositing a layer of a second conductive material comprises depositing an aluminum layer.

7. The method according to claim 2, wherein depositing a dielectric material layer comprises depositing a layer of a selected one of: tetraethyl orthosilicate, or borophosphosilicate glass.

8. A method for manufacturing a contact pad of at least one electronic device integrated in a semiconductor material chip, the method comprising:
    generating a succession of protruding elements on a main surface of the chip, each protruding element extending transversally to said main surface moving away from the chip and having a rounded terminal portion with a transversal cross-section that is substantially semicircular, each pair of adjacent protruding elements in the succession defining a respective opening, wherein generating a succession of protruding elements comprises:
        depositing a dielectric material layer on the main surface; and
        selectively etching the dielectric material layer for forming a succession of intermediate protruding elements having a transversal section that is substantially rectangular;
    rounding out the intermediate protruding elements for obtaining the protruding elements, wherein rounding out the intermediate protruding elements comprises heating the chip;
    partially filling said openings with a first conductive material for forming contact structures adapted to electrically contact the at least one integrated electronic device, and
    depositing a layer of a second conductive material in such a way to cover said protruding elements and electrically contact said contact structures.

9. The method according to claim 1, wherein the substantially semicircular transversal cross-section of the rounded terminal portion has a radius of curvature depending on a width of the protruding element.

10. The method according to claim 9, wherein the radius of curvature is equal to one-half the width.

11. An integrated circuit chip, comprising:
    a main surface of the chip;
    a plurality of protruding elements on the main surface of the chip, each protruding element having a rounded terminal portion with a cross-section that is substantially semicircular, wherein the substantially semicircular rounded terminal portion includes a substantially semicircular outer peripheral surface initiated from the main surface of the chip, and wherein pairs of adjacent protruding elements define a respective opening therebetween;
    a first conductive material at least partially filling said openings and adapted to electrically contact an integrated electronic device formed in the main surface;
    a layer of a second conductive material which covers said protruding elements and is in electrical contact with said first conductive material.

12. The chip of claim 11, wherein the substantially semicircular transversal cross-section of the rounded terminal portion has a radius of curvature depending on a width of the protruding element.

13. The chip of claim 12, wherein the radius of curvature is equal to one-half the width.

14. An integrated circuit chip, comprising:
    at least one electronic device integrated in a semiconductor material wafer having a main surface,
    a succession of protruding elements, each protruding element extending transversally to said main surface and having a rounded terminal portion with a transversal cross-section that is semicircular, wherein the substantially semicircular rounded terminal portion includes a substantially semicircular outer peripheral surface initiated from the main surface of the chip, and
    at least one contact pad for said at least one electronic device, said contact pad comprising:
        a plurality of contact structures in a first conductive material, each contact structure extending transversally to the main surface and positioned between a respective pair of protruding elements, and
        a layer of a second conductive material covering said protruding elements and in electrical contact with said contact structures,
    wherein said at least one integrated electronic device is located in portions of the semiconductor material chip under the protruding elements and in electrical contact with the contact structures.

15. The chip of claim 14, wherein the contact structures have a height reaching an intermediate portion of the terminal portions of the protruding elements.

16. The chip of claim 14, wherein the contact structures include a V-shaped opening that is filled with the second conductive material.

17. The chip of claim 14, wherein the semicircular transversal cross-section of the rounded terminal portion has a radius of curvature depending on a width of the protruding element.

18. The chip of claim 17, wherein the radius of curvature is equal to one-half the width.

19. A method, comprising:
    forming a plurality of protruding elements on a main surface of integrated circuit substrate, each protruding element extending perpendicularly to said main surface and having, at a distal end, a rounded upper surface with a cross-section that is semicircular, wherein pairs of adjacent protruding elements in the succession each defining a respective opening therebetween, wherein forming the plurality of protruding elements further comprises applying heat to form the rounded terminal portion with the semicircular transversal cross-section;
    partially filling each opening with a first conductive material so as to form a contact structure in electrical contact with an integrated electronic device formed in the substrate; and
    depositing a layer of a second conductive material that covers said protruding elements and is in electrical contact with the contact structures formed from the first conductive material.

20. The method of claim 19, wherein forming the plurality of protruding elements comprises:
    depositing a layer of dielectric material on the main surface;
    selectively etching the dielectric material to form a plurality of rectangular elements;

heating the rectangular elements to reflow the dielectric material and form the rounded upper surface of each protruding element.

21. The method of claim 19, wherein partially filling each opening with the first conductive material further comprises forming a V-shaped opening in each contact structure, and wherein depositing the layer of a second conductive material further comprises filling the V-shaped openings with the second conductive material.

22. The method of claim 19, wherein partially filling comprises filling each opening with first conductive material to height reaching at least to the rounded upper surface of the protruding elements.

23. The method of claim 19, wherein the semicircular cross-section of the rounded upper surface has a radius of curvature depending on a width of the protruding element.

24. The method of claim 19, wherein the radius of curvature is equal to one-half the width.

25. An integrated circuit chip, comprising:
a main surface of the chip;
a plurality of protruding elements on the main surface of the chip, each protruding element having a rounded terminal portion with a cross-section that is substantially semicircular and consisting of a single material, wherein pairs of adjacent protruding elements define a respective opening therebetween;
a first conductive material at least partially filling said openings and adapted to electrically contact an integrated electronic device formed in the main surface;
a layer of a second conductive material which covers said protruding elements and is in electrical contact with said first conductive material, and wherein the plurality of protruding elements of the single material is in contact with both the main surface of the chip and the layer of the second conductive material.

\* \* \* \* \*